US010062602B2

(12) United States Patent
Posseme et al.

(10) Patent No.: US 10,062,602 B2
(45) Date of Patent: Aug. 28, 2018

(54) METHOD OF ETCHING A POROUS DIELECTRIC MATERIAL

(71) Applicants: COMMISSARIAT A L'ENERGIE ATOMIQUE ET AUX ENE ALT, Paris (FR); CNRS Centre National de la Recherche Scientifique, Paris (FR); APPLIED MATERIALS, Inc., Santa Clara, CA (US)

(72) Inventors: Nicolas Posseme, Grenoble (FR); Sebastien Barnola, Carantec (FR); Olivier Joubert, Meylan (FR); Srinivas Nemani, Santa Clara, CA (US); Laurent Vallier, Meylan (FR)

(73) Assignees: COMMISSARIAT A L'ENERGIE ATOMIQUE ET AUX ENERGIES ALTERNATIVES, Paris (FR); CNRS—Centre National de la Recherche Scientifique, Paris (FR); APPLIED MATERIALS, Inc, Santa Clara, CA (US)

(*) Notice: Subject to any disclaimer, the term of this patent is extended or adjusted under 35 U.S.C. 154(b) by 310 days.

(21) Appl. No.: 14/142,124

(22) Filed: Dec. 27, 2013

(65) Prior Publication Data

US 2014/0187035 A1     Jul. 3, 2014

(30) Foreign Application Priority Data

Dec. 28, 2012   (FR) ...................................... 12 62910

(51) Int. Cl.
*H01L 21/311*     (2006.01)
*H01L 21/768*     (2006.01)
*H01L 21/02*      (2006.01)

(52) U.S. Cl.
CPC .. *H01L 21/76802* (2013.01); *H01L 21/02063* (2013.01); *H01L 21/31116* (2013.01);
(Continued)

(58) Field of Classification Search
CPC ......... H01L 21/76802; H01L 21/76814; H01L 21/02063; H01L 21/31116; H01L 21/31144; H01L 2221/1063
(Continued)

(56) References Cited

U.S. PATENT DOCUMENTS 4,450,042 A * 5/1984  Purdes ................ H01L 21/3065
                                                              204/192.32
5,370,769 A * 12/1994 Kadomura ........ H01L 21/30621
                                                              257/E21.222

(Continued)

FOREIGN PATENT DOCUMENTS

EP        1 233 449 A2    8/2002

OTHER PUBLICATIONS

Zhang et al., Low Damage Cryogenic Etching of Porous Organosilicate Low-k Materials Using SR6/O2/SiF4, ECS Journal of Solid State and Technology, 2(6) N131-N139 (2013).*

(Continued)

*Primary Examiner* — Mary Wilczewski
(74) *Attorney, Agent, or Firm* — Oblon, McClelland, Maier & Neustadt, L.L.P.

(57) ABSTRACT

The invention relates to a method of etching a layer of porous dielectric material, characterized in that the etching is performed in a plasma formed from at least one silicon-based gas mixed with oxygen ($O_2$) and/or nitrogen ($N_2$) so as to grow a passivation layer all along said etching, at least on flanks of the layer of porous dielectric material and wherein the silicon-based gas is taken from all the compounds of the type $Si_xH_y$, for which the ratio x/y is equal or
(Continued)

greater than 0.3 or is taken from all the compounds of the following types: $Si_xF_y$ and $Si_xCl_y$, where x is the proportion of silicon (Si) in the gas and y is the proportion of fluorine (F) or chlorine (Cl) or hydrogen (H) in the gas.

28 Claims, 9 Drawing Sheets

(52) U.S. Cl.
 CPC .. *H01L 21/31144* (2013.01); *H01L 21/76814* (2013.01); *H01L 2221/1063* (2013.01)
(58) Field of Classification Search
 USPC .......................................................... 438/695
 See application file for complete search history.

(56) References Cited

U.S. PATENT DOCUMENTS

| | | | | |
|---|---|---|---|---|
| 5,427,913 | A * | 6/1995 | Shaw | G01N 33/86 435/13 |
| 5,661,344 | A * | 8/1997 | Havemann | H01L 21/02126 257/637 |
| 6,413,877 | B1 * | 7/2002 | Annapragada | H01L 21/31133 257/E21.255 |
| 6,465,159 | B1 * | 10/2002 | Ni | H01L 21/31138 216/37 |
| 6,518,174 | B2 * | 2/2003 | Annapragada | H01L 21/31116 257/E21.252 |
| 6,566,283 | B1 * | 5/2003 | Pangrle | H01L 21/31058 257/E21.242 |
| 6,762,127 | B2 * | 7/2004 | Boiteux | H01L 21/02126 216/67 |
| 6,821,884 | B2 * | 11/2004 | Vanhaelemeersch | H01L 21/31138 257/E21.256 |
| 6,936,881 | B2 * | 8/2005 | Yeo | H01L 21/84 257/296 |
| 6,969,685 | B1 | 11/2005 | Li et al. | |
| 7,005,390 | B2 * | 2/2006 | RamachandraRao | H01L 21/76808 257/783 |
| 7,122,481 | B2 * | 10/2006 | Kloster | H01L 21/3105 216/46 |
| 7,288,483 | B1 * | 10/2007 | Brown | H01L 21/02063 257/E21.252 |
| 7,335,586 | B2 * | 2/2008 | RamachandraRao | H01L 21/02118 257/E21.151 |
| 8,062,983 | B1 * | 11/2011 | Draeger | H01L 21/02126 257/E23.145 |
| 8,741,775 | B2 * | 6/2014 | Nemani | H01L 21/3105 438/699 |
| 8,980,754 | B2 * | 3/2015 | Zhou | H01L 21/3105 438/695 |
| 8,987,139 | B2 * | 3/2015 | Kao | H01L 21/31144 438/695 |
| 9,165,783 | B2 * | 10/2015 | Nemani | H01L 21/3105 |
| 2002/0119664 | A1 * | 8/2002 | Annapragada | H01L 21/31116 438/700 |
| 2002/0173142 | A1 * | 11/2002 | Vanhaelemeersch | H01L 21/31138 438/637 |
| 2004/0018452 | A1 * | 1/2004 | Schilling | B08B 7/0021 430/314 |
| 2004/0072436 | A1 * | 4/2004 | RamachandraRao | H01L 21/76808 438/692 |
| 2005/0048782 | A1 | 3/2005 | Vanhaelemeersch et al. | |
| 2005/0056941 | A1 | 3/2005 | Vanhaelemeersch et al. | |
| 2005/0077597 | A1 * | 4/2005 | Toma | H01L 21/02063 257/629 |
| 2005/0215072 | A1 * | 9/2005 | Kevwitch | H01L 21/02063 438/778 |
| 2006/0108320 | A1 * | 5/2006 | Lazovsky | B82Y 30/00 216/2 |
| 2007/0032087 | A1 * | 2/2007 | Nishino | H01L 21/76814 438/706 |
| 2007/0077781 | A1 * | 4/2007 | Lee | H01L 21/02063 438/781 |
| 2007/0077782 | A1 * | 4/2007 | Lee | H01L 21/02063 438/781 |
| 2007/0173073 | A1 * | 7/2007 | Weber | H01L 21/02203 438/787 |
| 2007/0249156 | A1 * | 10/2007 | Bonilla | H01L 21/02074 438/622 |
| 2008/0032064 | A1 * | 2/2008 | Gordon | C23C 16/0218 427/578 |
| 2008/0061442 | A1 * | 3/2008 | Ko | H01L 21/3121 257/774 |
| 2008/0207005 | A1 * | 8/2008 | Farkas | H01L 21/02063 438/745 |
| 2008/0241499 | A1 * | 10/2008 | Sinapi | H01L 21/02074 428/304.4 |
| 2008/0311756 | A1 * | 12/2008 | Chen | H01L 21/02063 438/700 |
| 2011/0079918 | A1 * | 4/2011 | Zhou | H01L 21/02063 257/774 |
| 2012/0178241 | A1 * | 7/2012 | Malone | H01B 1/02 438/478 |
| 2013/0023124 | A1 * | 1/2013 | Nemani | H01L 21/31144 438/703 |
| 2013/0109187 | A1 * | 5/2013 | Nemani | H01L 21/76814 438/710 |
| 2014/0017898 | A1 * | 1/2014 | Nemani | H01L 21/308 438/703 |
| 2014/0120726 | A1 * | 5/2014 | Nemani | H01L 21/3105 438/694 |
| 2014/0187035 | A1 * | 7/2014 | Posseme | H01L 21/02063 438/618 |
| 2014/0213060 | A1 * | 7/2014 | Kao | H01L 21/31144 438/703 |
| 2014/0227876 | A1 * | 8/2014 | Tohnoe | H01L 21/3065 438/695 |
| 2015/0118863 | A1 * | 4/2015 | Rathod | H01L 21/02164 438/778 |
| 2016/0379819 | A1 * | 12/2016 | Ren | H01L 21/02126 438/675 |

OTHER PUBLICATIONS

French Preliminary Search Report and Written Opinion dated Aug. 14, 2013, in Patent Application No. FR 1262910, filed Dec. 28, 2012 (With English Translation of Category of Cited Documents).
"Thursday Morning, Nov. 1, 2012", AVS 59th Annual International Symposium and Exhibition, XP 002711224, Nov. 1, 2012, pp. 1-3.

* cited by examiner

Prior Art

Prior Art

Prior Art

METHOD OF ETCHING A POROUS DIELECTRIC MATERIAL

TECHNICAL FIELD OF THE INVENTION

The present invention concerns in general the use of porous dielectric materials with low permittivity for realizing electrical interconnections in integrated circuits and more particularly an improved method for etching these materials.

PRIOR ART

The constant objective of the microelectronics industry for decades has been to be capable of producing, at low cost, integrated circuits (IC) that are ever denser with ever higher performances. Since the introduction in the past few years of technological families or "nodes" with decananometric dimensions, that is to say expressed in tens of nanometers (nm=$10^{-9}$ meters), it is found that the performance of the circuits is no longer essentially dependent on the switching speed of the active elements, the transistors, as was the case for a long time, but depends largely on the propagation times of the signals on the metal interconnection lines between transistors.

The speed of propagation of the electrical signals on the metal interconnection lines depends on the electrical resistance (R) of the lines and the capacitance (C) between adjacent metal lines forming a time constant (RC) that opposes the rapid changes in the electrical levels that it is wished to propagate. In order to increase the switching speed, and/or to obtain a lesser power dissipation in the circuits, it is therefore necessary to decrease this time constant.

At the end of the 1990s a significant reduction in the electrical resistance of the interconnection lines had already been obtained with the introduction of copper, in replacement for aluminium, and its so-called damascene technology in which the copper lines are encrusted in the dielectric material separating them, essentially silicon dioxide ($SiO_2$) originally. For decananometric technological nodes, the improvement afforded by the use of copper has however proved to be insufficient and it has been necessary to envisage also using dielectric material with a lower permittivity in order to reduce the time constant (RC) by this time reducing the capacitance.

Thus, when the 90 nm technological node was introduced, silicon dioxide ($SiO_2$), which has a dielectric constant (denoted k, the dielectric constant is the permittivity of the material relative to air) of around 4, was replaced by an oxide based on the use of the methyl group (—$CH_3$) associated with silicon (Si) in order to form a dielectric compound Si—$CH_3$ and more particularly the modified oxide SiOCH, the dielectric constant of which is around 2.9. More generally, it is a case of oxides doped with carbon and hydrogen in order to form materials of the so-called silsesquioxane type from the formula $(R—SiO_{3/2})_n$. They have a structure in cage form containing eight silicon atoms placed at the vertex of a cube. The substituent —R may be a methyl group —$CH_3$, and methyl silsesquioxane (MSQ) is then spoken of, or a hydrogen atom —H, and in this case hydrogen silsesquioxane (HSQ) is spoken of.

In order to continue to progress in this direction, that is to say to reduce the permittivity of the dielectric significantly, the approach adopted for putting the 45 nm technological node into production consisted of making the SiOCH porous, which is then denoted p-SiOCH. The formation of pores in the SiOCH material further reduces the dielectric constant k until values of around 2.5 to 2.3 or even less are achieved. It should be noted here that this type of material is then, in the technical literature, given the term "ultra low-k" or ULK.

However, the porosity of the material thus obtained creates problems related to a lower mechanical strength and to a high susceptibility to the absorption of moisture. The incorporation of ULK materials in the technological methods for producing technological nodes as from 45 nm therefore certainly poses problems, in particular of etching the porous material when the interconnections are formed.

The greater sensitivity of this type of dielectric to etching is manifested in the damascene method, which is utilised for using copper, which is of course continued to be used for benefitting from the lower electrical resistivity of this material. In the context of this method, the etching of the dielectric material is anisotropic. The plasma is typically a plasma based on fluorocarbon products of the following type: $C_4F_8$, $CF_4$, $C_4F_6$ or $CHF_3$.

One of the approaches for the integration of porous SiOCH is the use of organic resists as a mask for the etching. After etching of the SiOCH, it is then necessary to remove the remaining organic resist. This action of organic removal is generally referred to as ashing, which expresses the removal of the remaining "ashes". The chemicals normally used for this removal are based in particular on oxygen and hydrogen nitride ($H_3N$). They result in modifying the porous SiOCH by transforming it into $SiO_2$, which gives rise to a high increase in the dielectric constant and runs directly counter to the aim sought. At these integration levels, 45 nm and beyond, plasma etching also generally requires the use of a metallic hard mask instead of the organic resists used by conventional photolithography, in particular because the selectivity in etching vis-à-vis p-SiOCH is insufficient, because of the low thicknesses of resist that it is necessary to be able to use in order to define patterns of decananometric sizes.

The use of a porous material such as SiOCH is therefore often combined with the use of a metal hard mask, which however never fails to create other problems, which are disclosed below.

FIGS. 1a to 1e illustrate the various problems generated by the etching of the porous dielectric, p-SiOCH, using a fluorocarbon plasma, and the use of a hard mask made from titanium nitride (TiN).

Figure 1A:
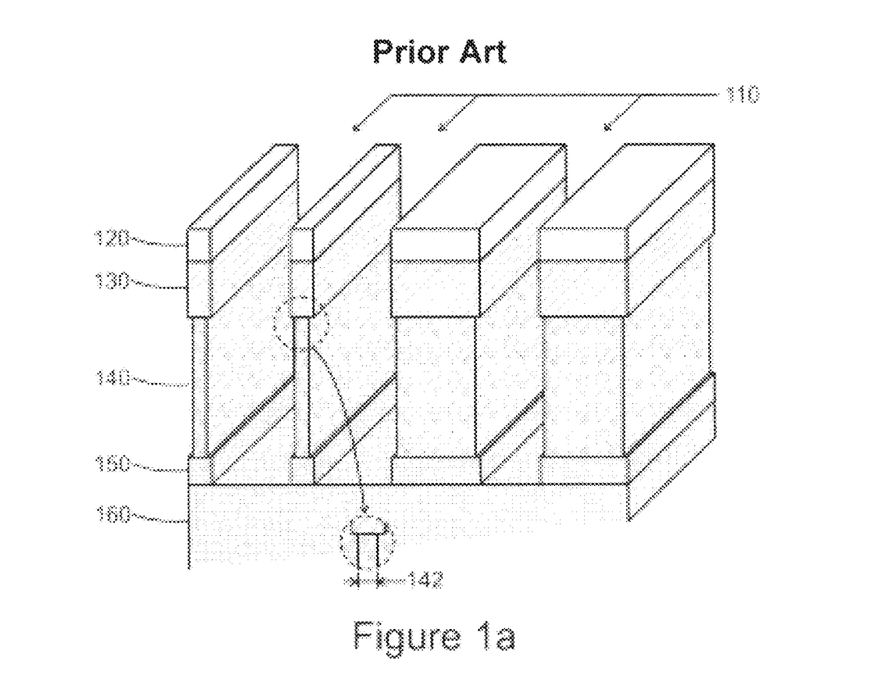
FIGS. 1a to 1e illustrate the various problems caused by the etching of the porous dielectric, p-SiOCH, using a fluorocarbon plasma, and the use of a hard mask made from titanium nitride (TiN).

FIG. 1a illustrates the structure of the interconnection lines after etching in a fluorocarbon plasma of the porous material used as a dielectric, p-SiOCH, and before filling of the trenches 110, as implemented in the conventional so-called damascene method of forming interconnections made from copper.

As mentioned previously, the etching is done using a hard mask 120, typically made from titanium nitride (TiN), which covers a layer 130 of silicon dioxide ($SiO_2$) serving as a stop layer for the step of chemical-mechanical polishing (CMP) during the subsequent formation of the copper interconnections with the damascene method. Under the layer of the porous dielectric material, SiOCH 140, a layer 150 serving as a stop during the plasma etching is found. The global layer 160 represents all the underlying layers of the integrated circuit, in particular those containing the active components that are realised during the preliminary steps of the method, those that precede the so-called "BEOL" operations, the acronym for "back-end of line" or "end of line" steps during which, at relatively low temperatures, all the interconnection levels are realised between the active components and where all the dielectric layers will be etched successively.

FIG. 1a illustrates a first problem related to the greater sensitivity of the porous material during conventional etching in a fluorocarbon plasma. A greater consumption of the porous material is observed, corresponding to an overetching 142 of this layer. Moreover, there is absorption of moisture (not shown), which increases the dielectric constant, which runs counter to the aim sought and also affects the reliability of the device produced.

Figure 1B:
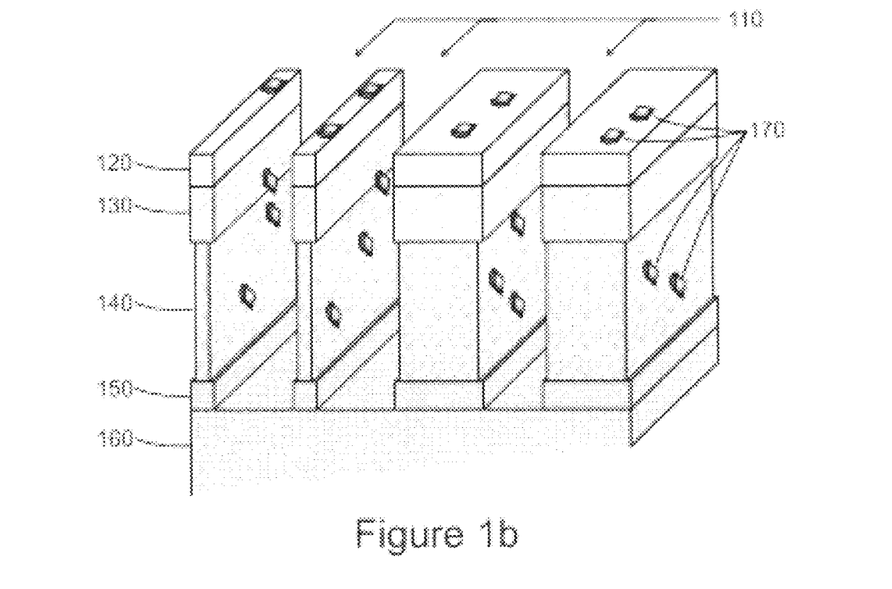

FIG. 1b illustrates a second problem that relates to the use of a metal hard mass. After the trenches have been etched, they are exposed to the air and the growth of residues 170 is noted. The growth of these residues is all the greater, the longer the trenches are left open to the air. The mechanism of formation of the residues is attributed to the fluorinated species present on the hard mask made from metal and on the surfaces of the porous material with low permittivity after it has been etched in the fluorocarbon plasma. The fluorinated species then react with the moisture in the air, producing hydrofluoric acid (HF), which forms metallic salts with the hard mask. These residues affect the quality of the following depositions: that of the layer forming a barrier to the diffusion of copper, and that of the layer of copper that will serve to form all the metal interconnections (the use of copper requires the prior deposition of a layer intended to prevent the diffusion of it in the semiconductor materials used for realising the transistors, generally silicon). These residues may produce unwanted vias between lines (short-circuits) and breaks in lines (open circuits) that significantly affect the efficiency of manufacture of the devices produced.

Figure 1C:
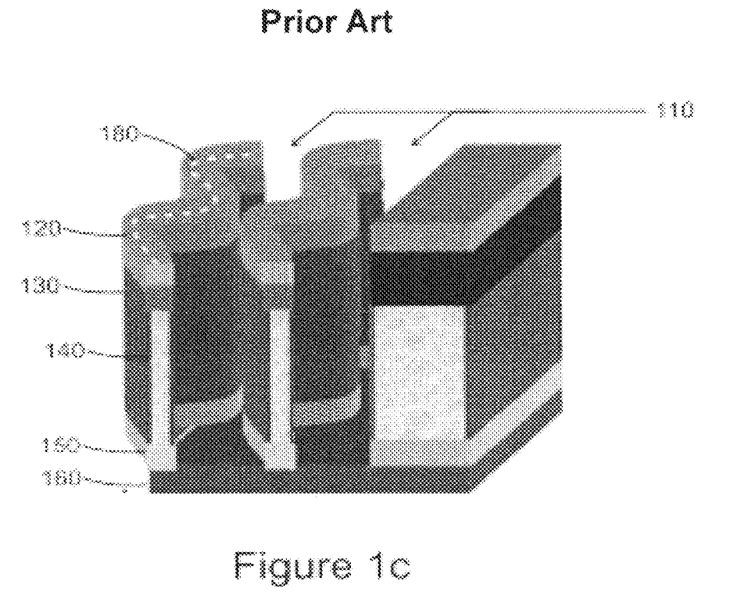

FIG. 1c illustrates another problem related to the use of a metal hard mask. With the constant reduction in the dimensions, the technological nodes as from 45 nm, and those of smaller sizes, reveal a problem of undulation 180 of the most dense interconnection lines, that is to say where there remains the narrowest width of insulating material between the lines. The phenomenon is created during etching by the hard mask, which applies a residual compression to the underlying porous dielectric material, the elasticity of which is limited. A deformation of the densest lines is therefore observed in the form of undulations or "wiggling".

Figure 1D:
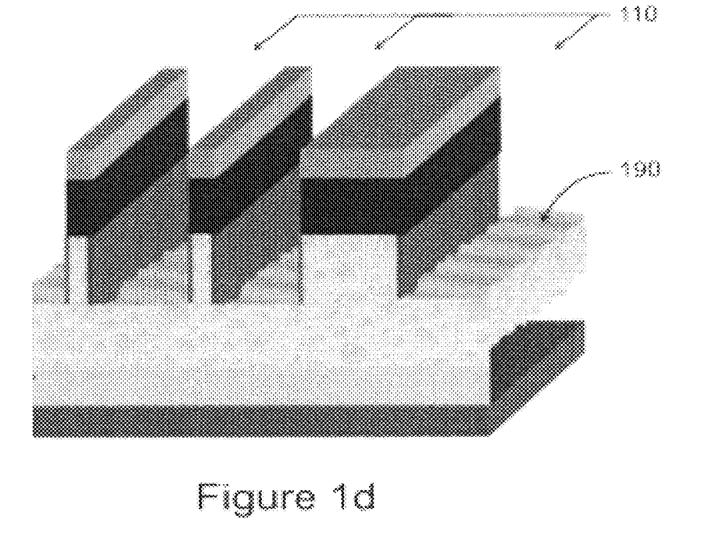

FIG. 1d Illustrates further another drawback resulting from the use of a hard mask. When the porosity of the dielectric layer 140 is increased for the purpose of obtaining a lower dielectric constant, a correlative increase is also noted in the roughness 190 of the bottoms of interconnection lines after etching. This roughness of the line bottoms, though it does not affect the following operation of filling the trenches by electromigration, does however degrade the reliability of the device produced by reducing the service life of the dielectric before rupture, which is measured by means of a parameter known as TDDB, the acronym for "time-dependent dielectric breakdown". The roughness observed is attributed to the presence of the hard mask made from titanium nitride (TiN) by means of a phenomenon of micro-masking resulting from the condensation of non-volatile fluorinated compounds of the $TiF_x$ type resulting from the partial sputtering of the mask during etching in the fluorinated plasma. The roughness is also caused by the porous material itself (p-SiOCH), which may crack under the effect of the plasma.

Moreover, the use of a metal hard mask also has a strong impact on the stability of the etching process and on the reproducibility thereof. During successive uses of the plasma reactor, a drift is observed in the etching speeds and the uniformity thereof on an edge that does not appear when a traditional organic hard mask is used. An accumulation of compounds based on titanium is in particular found on the walls and on the top electrodes of the plasma reactor, which leads to a micromasking of these electrodes. These drawbacks are referred to as "chamber defectivity" in the technical literature.

Figure 1E:
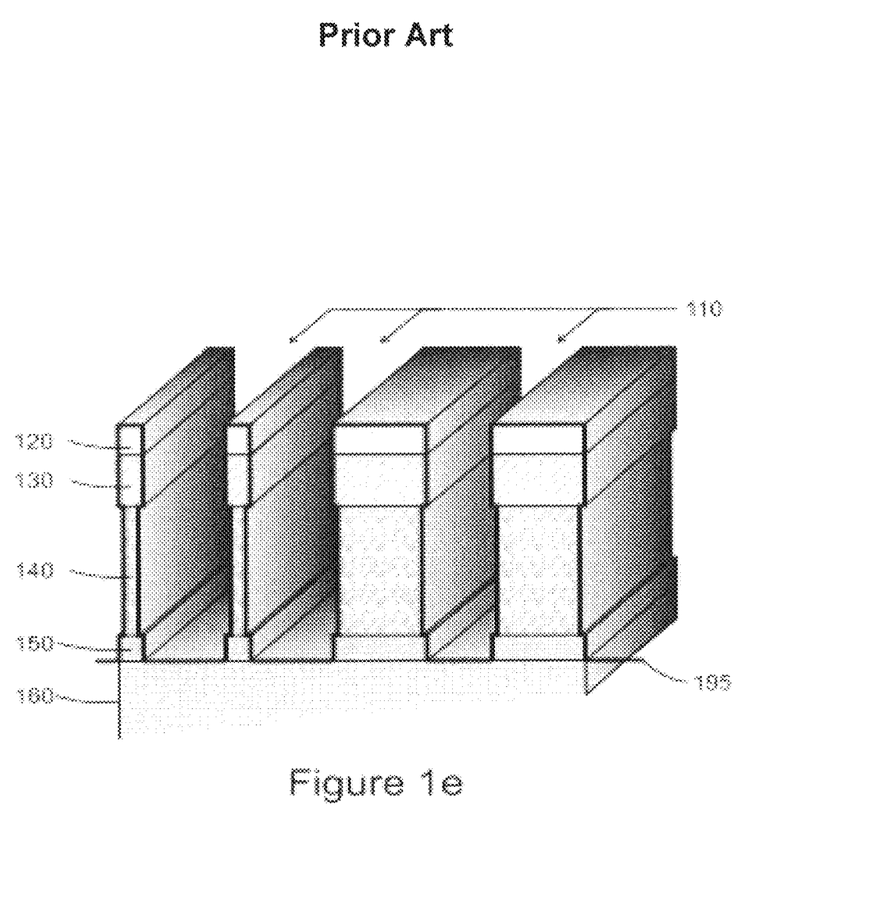

FIG. 1e illustrates yet another critical problem that is related to wet cleaning based on the use of hydrofluoric acid (HF) and which proves to be not sufficiently effective to eliminate all the fluorocarbon layer formed during etching. After wet cleaning fluorine remains on the flanks. It is encapsulated during the deposition of the metal barrier 195, which must be deposited before the deposition of copper in order to prevent the migration of the latter as explained previously. This fluorine may lead to a degradation in reliability of the porous dielectric film, p-SiOCH. An aggressive wet cleaning that would remove all the layer of fluorine would have the drawback of leading to a loss of definition of the critical dimensions (CDs) of the devices manufactured.

Consequently, despite the use of a hard mask, generally a metal mask made from titanium nitride (TiN), the use of porous materials with low permittivity that are necessary to reduce the time constant of the interconnections between the active components of an integrated circuit, and in particular etching thereof in a fluorocarbon plasma, poses numerous problems.

The objective of the present invention is to limit or eliminate at least some of these problems.

The other objects, features and advantages of the present invention will emerge from an examination of the following description and the accompanying drawings. Naturally other advantages may be incorporated.

SUMMARY OF THE INVENTION

The invention relates to a method of etching a layer of porous dielectric material. The etching is carried out in a plasma based on silicon so as to grow, all along said etching, a passivation layer, at least on the flanks of the layer of the porous dielectric material. All gases based on silicon may be used. Preferentially, all compounds of the $Si_xF_y$, $Si_xCl_y$ and $Si_xH_y$ are able to suit. Preferably, as regard to the silicon-based gas taken from all the compounds of the type $Si_xH_y$, the ratio x/y is equal or greater than 0.3. Thus it is possible to use for example one of the following gases: silicon tetrachloride ($SiCl_4$), silicon tetrafluoride ($SiF_4$) or silane ($SiH_4$), or one of the following gases: $Si_2F_6$, $Si_3F_8$, $Si_2Cl_6$, $Si_2H_4$ and $Si_2H_6$.

Thus the passivation of layer based on silicon that develops throughout the etching protects the porous dielectric material from any contamination or modification.

Preferably, the mixture of gas forming the plasma also comprises nitrogen ($N_2$) and/or oxygen ($O_2$). The presence of nitrogen and/or oxygen reinforces the growth of the passivation layer on the flanks.

According to another embodiment, the invention relates to a method of realising an electrical interconnection. The method comprises the etching of a pattern forming a trench according to the steps of the invention. The method comprises the etching of a pattern forming a trench according to the steps of the invention. It preferably also comprises a subsequent step of filling the trench with an electrically conductive material.

The invention is however not limited to the realisation of the interconnections between the active components of an integrated circuit, that is to say the transistors. It is suitable whenever it is necessary to etch a porous material of the SiOCH type. For example, the gate spacers of the transistors, which are currently produced from silicon nitride, may also be made from porous SiOCH in order to reduce the parasitic capacitances between the gate on the one hand and the other electrodes of the transistor, that is to say source and drain.

Thus, according to a non-limitative embodiment, the pattern forms a trench and according to another non-limitative embodiment the pattern may serve to remove the layer of porous dielectric material outside the flanks of the gate in order to leave spacers in place.

According to another embodiment, the invention relates to a method for etching a layer of porous dielectric material, in which the etching is carried out in a silicon-based plasma in the presence of oxygen ($O_2$) and/or nitrogen ($N_2$).

According to one option, the etching defines a pattern in a layer of porous dielectric material and comprises, prior to the etching, the definition of the pattern in a mask surmounting the layer of porous dielectric material, the etching of the layer of porous dielectric material then being effected through the mask.

According to another embodiment, the invention relates to a method for etching at least one pattern in a layer of porous dielectric material. The method comprises: the definition of the pattern in a mask surmounting the layer of porous dielectric material; at least one etching of the layer of porous dielectric material through the mask. The etching is performed in a plasma comprising a gas based on silicon and nitrogen ($N_2$) and/or oxygen ($O_2$) so as to grow a passivation layer all along said etching, at least on the flanks of the layer of porous dielectric material.

BRIEF DESCRIPTION OF THE FIGURES

The aims and objects as well as the features and advantages of the invention will emerge more clearly from the detailed description of an embodiment thereof that is illustrated by the following accompanying drawings, wherein.

The drawings are given by way of examples and are not limitative of the invention. They constitute schematic outline representations intended to facilitate understanding of the invention and are not necessarily to the scale of practical applications. In particular, the relative thicknesses of the various layers are not representative of reality.

In the context of the present invention, the term "on", "surmounts" or "underlying" or the equivalents thereof do not necessarily mean "in contact with". Thus, for example, the deposition of a first layer on a second layer does not necessarily mean that the two layers are directly in contact with each other but means that the first layer at least partially covers the second layer while being either directly in contact therewith or being separated therefrom by another layer or another element.

DETAILED DESCRIPTION OF THE INVENTION

Before beginning a detailed review of embodiments of the invention, optional features that may optionally be used in association or alternatively are given below:

It should be stated first of all that the invention relates to a method of etching a layer of porous dielectric material. The etching is an etching of the plasma type. The plasma is formed from mixture of gases containing silicon such as for example $Si_xF_y$, $Si_xCl_y$ or $Si_xH_y$ and more generally all gases based on silicon (Si), and preferably containing nitrogen ($N_2$) and/or oxygen ($O_2$) so as to assist growth, all along said etching of a passivation layer.

Thus the invention makes it possible to etch the porous dielectric material without having recourse to a fluorocarbon product.

According to an advantageous but optional embodiment, the mixture of gases also comprises argon (Ar) or helium (He) so that the slope of the passivation layer is very inclined, that is to say vertical or close to vertical, which is for example an advantage for filling the trenches with a material such as copper. It turned out that argon or He, by acting on the dilution of the species of the plasma, reinforces the effect of this silicon-based gas on the passivation of the flanks.

According to one embodiment, the etching is carried out in a plasma based on silicon, and preferably silicon tetrachloride ($SiCl_4$) or silicon tetrafluoride ($SiF_4$), in the presence of nitrogen ($N_2$) and oxygen ($O_2$) combined with argon (Ar), and the passivation layer (112) is a silicon oxide ($SiO_x$). According to another embodiment the etching is carried out in a plasma based on silicon, and preferably silicon tetrachloride ($SiCl_4$) or silicon tetrafluoride ($SiF_4$), in the presence of nitrogen ($N_2$) combined with argon (Ar) and the passivation layer (112) is a silicon nitride ($SiN_xF_y$ or $SiN_xCl_y$). According to another embodiment, the etching is carried out in a plasma based on silicon, and preferably silicon tetrachloride ($SiCl_4$) or silicon tetrafluoride ($SiF_4$), in the presence of nitrogen ($N_2$) and oxygen ($O_2$) combined with argon (Ar) and the passivation layer (112) is a silicon oxynitride ($SiON_xF_y$ or $SiON_xCl_y$).

According to an embodiment, the silicon-based gas is taken from all the compounds of the type $Si_xH_y$ for which the ratio x/y is greater than or equal to 0.3 and preferably greater than or equal to 0.4 and preferably greater than or equal to 0.5, such as for example Si2H4 and Si2H6.

During the development of the present invention, it has been noticed that this ratio significantly improves the passivation of the flanks and thus protects more efficiently the porous dielectric material.

According to one embodiment, during the etching, the temperature of the layer of porous dielectric material is maintained between 10° C. and 200° C. Preferably this temperature is maintained between 40° C. and 100° C. Typically to maintain the temperature of the latter, a substrate on which the layer of porous dielectric material rests is maintained and monitored. It is thus possible to maintain the layer of porous dielectric material at room temperature, but a higher temperature is preferred.

This temperature allows promoting the volatility of species (e.g. titanium nitride) from the mask that are volatilized during the etching. However, during the development of the present invention, it was found that if these species are not sufficiently volatile, then they re-deposit on the porous dielectric material to be etched. These re-deposited particles then prevent the local etching of the porous dielectric material. Therefore, these particles form locally a micro masking and cause a deterioration of the surface of the porous dielectric material.

Thus, the invention is clearly different from etching performed under cryogenic conditions which requires very specific etching chemistries and does not allow using chemistries used with temperatures greater than 0° C.

Advantageously but non-limitatively, the pattern is a trench.

Advantageously, a step is carried of removing the passivation layer after etching of the porous dielectric material, the removal step comprising a step of wet cleaning in order to fully dissolve the passivation layer.

Preferably, the wet cleaning uses a solution based on hydrofluoric acid (HF).

Advantageously, the porous dielectric material is porous SiOCH. More generally, it is a case of oxides doped with carbon and hydrogen in order to form materials of the so-called silsesquioxane type from the formula (R—SiO$_{2/3}$)$_n$. The substitute —R may be a methyl group —CH3, and then methyl silsesquioxane (MSQ) is then spoken of, or a hydrogen atom —H, and in this case hydrogen silsesquioxane (HSQ) is spoken of. Preferably the porosity of the porous dielectric material is between 0% and 50% and preferably between 10% and 50%.

Advantageously, the following parameters are modified in order to adjust the inclination of the flanks formed by the etching in the layer of porous dielectric material. The parameters for acting on the profile are the nitrogen or oxygen concentration of the gas and the temperature of the trench. For example, the species being more volatile at high temperature, the higher the temperature of the trench the weaker the passivation layer obtained. The flanks are then more vertical. For the nitrogen and/or oxygen concentration, an optimum is to be found. A low concentration of nitrogen (N$_2$) and/or oxygen, below 30 sccm, or an excessively high concentration above 200 sccm, causes a weak passivation and the risk is then run of obtaining a profile in the form of a barrel or "bowing", the term often used to describe this type of profile. It should be noted here that a small quantity of H$_2$ (0-50 sccm) may be added to the Si$_x$F$_y$/N$_2$/Ar or Si$_x$Cl$_y$/N$_2$/Ar mixture in order to consume the fluorine or chlorine, thus affording greater polymerisation and the obtaining of steeper profiles. However, the addition of H$_2$, even in a small quantity, may give rise to a significant modification to the porous SiOCH by diffusion of H species through the pores. These then consume the methyl groups, which causes an increase in the dielectric constant and destroys the expected benefit of the etching chemistry of the invention.

These parameters make it possible to control the inclination of the flanks. In some cases, in particular when the diameter or width of the pattern is small, typically less than 20 nm, it may in fact be useful to have flanks that are slightly inclined, that is to say not vertical. This avoids the appearance of vacuum during the filling of the pattern with a material such as copper. Typically, a slope ranging from 80° to 89° and more precisely 85° to 88° with respect to the horizontal may be advantageous for assisting the filling of the patterns intended to form interconnections.

The above parameters also make it possible to adjust the thickness of the passivation layer.

Advantageously, several cycles are performed, each comprising a plasma etching of the layer of porous dielectric material and a removal of the passivation layer formed.

Advantageously, an etching of the layer of porous dielectric material effected by a succession of cycles of etching/removal of the passivation layer makes it possible to obtain more abrupt flanks.

Preferably, the removal of the passivation layer formed at each cycle is done dry by sublimating the solid species produced by the reaction of the passivation layer based on silicon nitride with the etching products generated by a plasma.

According to an advantageous application of the invention, the method comprises, before the etching of the layer of porous dielectric material, the realisation of a mask surmounting the layer of porous dielectric material. This mask has at least one pattern. The etching of the layer of porous dielectric material is formed through the mask in order to transfer the pattern into the layer of porous dielectric material.

According to a preferred embodiment, the hard mask is made from silicon dioxide (SiO$_2$), silicon nitride (SiN) and dense SiOCH. A hard mask made from organic resist may also be envisaged.

According to a preferred embodiment, the porous dielectric material is porous SiOCH and the hard mask is made from silicon dioxide (SiO$_2$), silicon nitride (SiN) or dense SiOCH and has a thickness of greater than one fifth of the thickness of the layer of porous dielectric material. The thickness for each of these layers is measured in a direction perpendicular to the plane in which the player of porous dielectric material extends. The thickness of the layer of porous dielectric material is measured between the bottom face of this layer, this bottom face being typically in contact with a stop layer and the protection layer.

Preferably, the hard mask has a bottom face in contact with the layer of porous dielectric material and a top face opposite to the bottom face. Said top face is in contact with the etching solution during the step of etching the layer of porous dielectric material through the mask.

Thus no other layer covers the hard mask made from silicon during etching. This embodiment makes it possible in particular to dispense with a metal hard mask, thereby eliminating the drawbacks caused by the use of this type of mask. Furthermore, this embodiment makes it possible to reduce the number of steps in realizing the pattern, thus increasing the production rate and reducing costs.

Advantageously, the thickness of the hard mask is adapted so as not to be entirely consumed during the plasma etching of the layer of porous dielectric material.

According to another embodiment, the hard mask is a metal mask preferably made from titanium nitride (TiN).

According to a preferred embodiment, prior to the definition of the pattern in the hard mask, a stop layer is disposed under the layer of porous dielectric material which, when it is subjected to the plasma used for etching the layer of porous dielectric material, has an etching speed less than the speed of etching of the layer of porous dielectric material. The stop layer is etched following the etching of the porous dielectric material using said plasma. The method is thus simplified, the number of steps is reduced while controlling the etching of the layer of dielectric material. Typically, the stopping of the etching of the stop layer takes place by controlling the etching time.

According to a preferred embodiment, a stop layer conformed so as to stop the etching of the layer of porous dielectric material is first disposed under the layer and, after the step of etching the layer of porous dielectric material and before the step of removing the passivation layer, a step of etching the stop layer is performed. According to a particular embodiment, this stop layer may be etched with the same chemistry as that used for etching the porous dielectric material.

Particularly advantageously, the stop layer is also conformed so as to prevent contamination of the layer of porous dielectric material by the underlying layers.

The stop layer is for example made from SiCH, SiN or SiCN.

According to a preferred embodiment, the pattern is a trench and the method comprises a subsequent step of filling the trench with an electrically conductive material. According to one embodiment, the trench forms an electrical interconnection. Typically, the trench is filled with copper.

According to another embodiment, before the etching step, the porous dielectric material covers a gate of a transistor. It is deposited uniformly on the gate. Preferably it is then etched anisotropically in a principal direction parallel to flanks of the gate so as to remain only on the flanks of the gate. The porous dielectric material thus forms spacers for the gate.

Preferably, the substrate or stack of layers has a top face directly in contact with the stop layer. The layer of porous dielectric material is directly in contact with the stop layer through its bottom face and directly in contact with the protection layer typically formed by a layer of silicon dioxide ($SiO_2$), silicon nitride (SiN) or dense, that is to say non-porous, SiOCH. In the case where the structure comprises a metal mask, the latter is preferably directly in contact with said protection layer.

The plasma is free from fluorocarbon products.

As presented in the section on the prior art, the drawbacks related to the use of the traditional etching method in the case of the use of a porous dielectric, of the SiOCH type, and of a metal hard mask made from titanium nitride (TiN) are numerous:

For those related to the use of a porous dielectric material, it should be noted that the material is then sensitive to the reactive species of the plasma during etching. There is modification of the film with consumption of material and absorption of moisture, which causes an increase in the dielectric constant and runs counter to the aim sought. Moreover, the porous dielectric film is etched in a fluorocarbon (FC) plasma and it becomes difficult to completely remove the remaining fluorine using wet cleaning based on hydrofluoric (HF) acid without degrading the dielectric film. The reliability of the device is affected thereby.

For those related to the use of a metal hard mask, the formation of residues after etching and exposure to the ambient air is observed, which causes a reduction in the manufacturing efficiency, undulation (wiggling) of the densest interconnection lines and defects related to the confinement chamber of the plasma reactor (chamber defectivity) which also cause a loss of efficiency.

Figure 2:
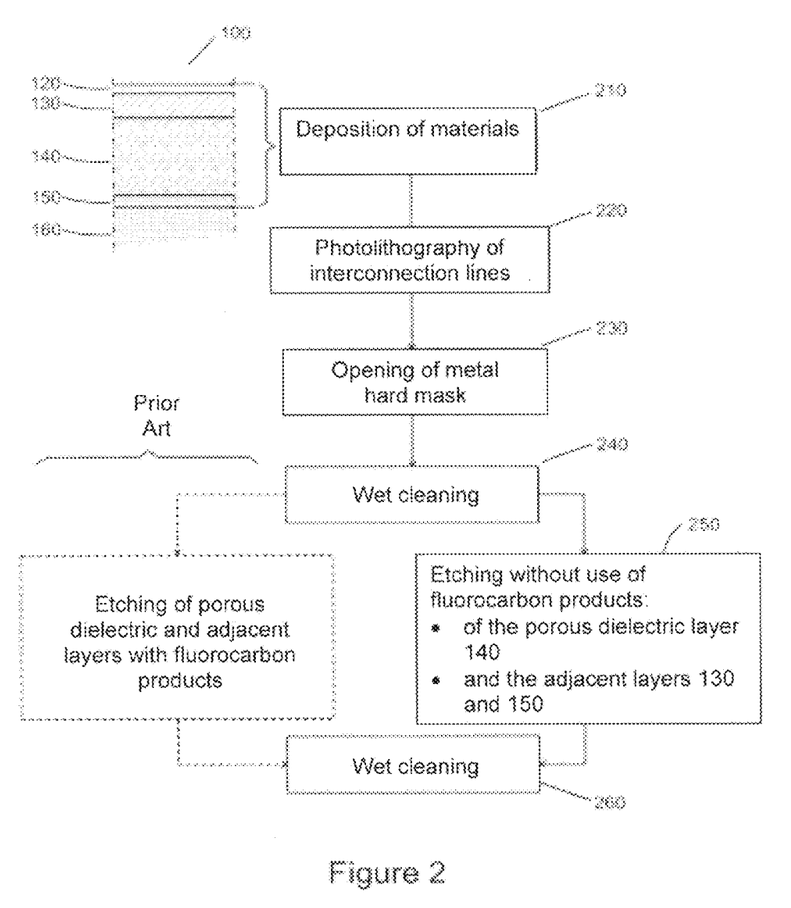
FIG. 2 summarizes the main steps of the method of the invention and the differences with the standard method of etching the porous dielectric in order to form trenches therein.

FIG. 2 summarizes the steps of etching the porous dielectric according to the method of the invention and emphasises the differences from the standard method.

First of all the deposition 210 of the various layers of material is carried out, including the porous dielectric material in which the interconnection lines will be etched. The various layers already described can be found, which are, in the order in which they are deposited: the etching stop layer 150; the porous dielectric material 140; the layer of oxide 130; the metal hard mask 120. In this layered structure 100 the global layer 160 or stack of layers represents, as already seen, all the underlying layers in which the active components, that is to say the transistors, have already been realized.

Advantageously but non-limitatively, the thicknesses and material of the above layers are:

The metal hard mask 120 is typically made, as seen, from silicon nitride (SiN) and lies in a thickness range from 5 to 100 nm and preferably 10 to 50 nm. In the context of the present invention, the metal hard mask 120 can also be produced from tantalum nitride (TaN) or boron nitride (BN).

The layer of oxide 130 is typically silicon dioxide ($SiO_2$) in a thickness range from 10 to 50 nm. It serves, as seen previously, as a stop layer for the operation of chemical-mechanical polishing (CMP) that is performed during the formation of the interconnections with the damascene method.

The layer 140 of porous dielectric is typically made from SiOCH and the thickness thereof lies in a range from 50 to 120 nm. This layer can be deposited by centrifugation, an operation that is generally referred to as spin coating, that is to say deposition by spreading by means of a spinner. The SiOCH is then deposited in a liquid form on the rotating slice and in its final porous form. It is also possible to work dry using plasma assisted chemical vapour deposition or PECVD. The deposition is then done in two steps using two precursor gases: one for generating the dense matrix of SiOCH, the other for forming the porogenic structure in which the volume proportion of the pores can be varied. In both cases the porosity of the dielectric is preferably greater than 15% in order to guarantee good effectiveness of the etching. It is typically between 15% and 50% and more generally between 0% and 50%.

The etching chemistry of the invention is not limited to SiOCH. It can also be done with other materials such as silicon dioxide ($SiO_2$) and silicon nitride (SiN).

The etching stop layer 150 typically has a thickness ranging from 10 to 20 nm and can consist of the following materials used in a standard way for back-end of line (BEOL) operations. They are silicon carbide (SiCH), silicon nitride (SiN) and silicon carbonitride (SiCN). The stop layer advantageously also fulfils a role of protection preventing contamination of the porous dielectric material by contaminating materials such as copper that are present in the bottom layers 160.

The following step 220 consists of defining by conventional photolithography, using a photosensitive resist, the patterns of the interconnection lines that will have to be etched in the porous dielectric layer. To do this use is made of a metal hard mask and the above patterns are therefore first of all transferred into the layer 120 generally made from titanium nitride (TiN). The patterns defined in the layer of resist (not shown) are therefore opened at the following step 230 in this layer. As will be explained in more detail below, the use of a hard mask is optional in the context of the present invention. These operations are followed by a wet cleaning step 240.

The invention differs essentially from the standard method in that the etching of the layer 130 made from $SiO_2$, the dielectric layer 140 made from porous SiOCH and the stop layer 150, which is carried out at the following step 250, is done as will be seen below without using fluorocarbon products.

In both cases the etching operation is followed by a new wet cleaning step 260.

FIGS. 3a to 3d detail the steps of the method of the invention.

Figure 3A:
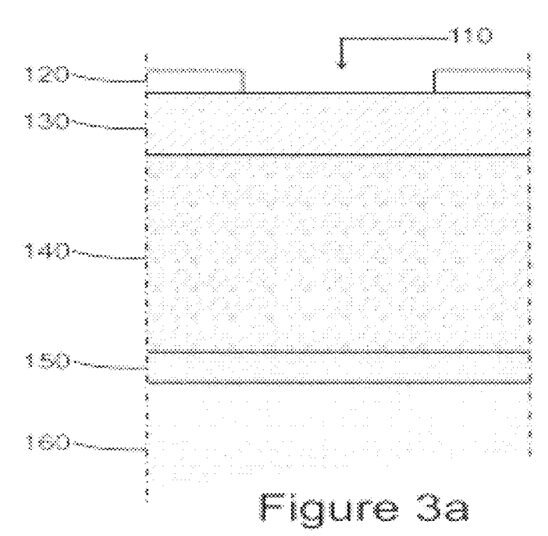
FIGS. 3a to 3d illustrate the various steps of the method of the invention.

FIG. 3a is a view in section of an interconnection line 110 in formation after etching of the metal hard mask 120. The titanium nitride (TiN) forming the hard mask is opened by means of chemistry based on chlorine ($Cl_2$) in apparatus dedicated to the etching of the metal in which a chlorinated plasma is formed.

Figure 3B:
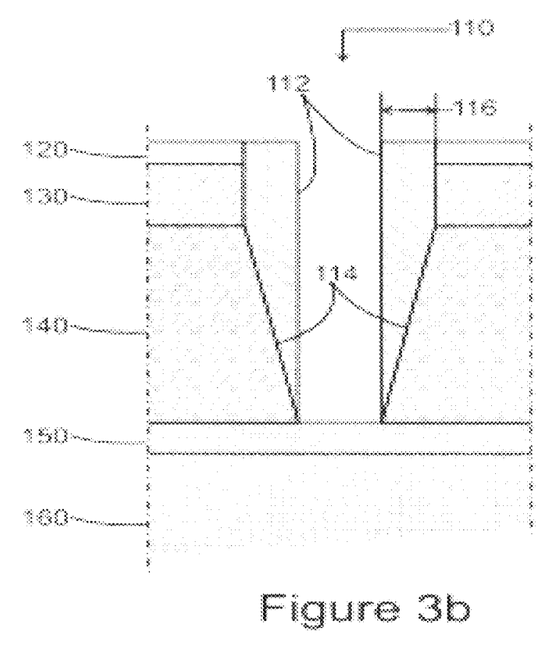

FIG. 3b illustrates the result of the step of etching of the $SiO_2$ layer 130, of the porous dielectric layer 140. As indicated subsequently, the chemistry of etching of the $SiO_2$ layer 130 and of the porous dielectric layer 140 may, according to a particular embodiment, also etch the stop layer 150. Unlike the contrary method, with the invention this layer made from SiOCH is etched in a plasma based on silicon such as silicon tetrachloride ($SiCl_4$) or silicon tetrafluoride ($SiF_4$) in the presence of nitrogen ($N_2$) combined with argon (Ar). As seen previously, all the gases based on silicon (Si) such as $Si_xF_y$, $Si_xCl_y$ or $Si_xH_y$ may also be suitable. During this operation there is the formation of a passivation layer 112 on the flanks of the trench. The formation of the passivation layer is promoted by the fact that the bombardment of the flanks of the patterns is weak whereas, on the other hand, on the bottom of the patterns, the bombardment prevents the formation of this layer.

Although, according to a preferred embodiment, the etching chemistry is the same for the layers 140 and 150, the layer 150 serves all the same as a stop layer. This is because the speed of etching of the material of the layer 150 is less than that of the material of the layer 140, in particular because of the porosity of the layer 140.

The etching of the $SiO_2$, the p-SiOCH and the stop layer stops on the layer 160. Because of the presence of the passivation layer, the etching is done without any modification to the porous dielectric layer. A plasma etcher of the ICP or CCP type is typically used. Advantageously, the same equipment is used as for the etching of the layers 130, 140 and 150. The advantageous ranges of values of the conditions of implementation of this etching are summarized in the table below, without the invention being limited to these values:

Power of the source: 0-2000 watts
Bias power (control of the energy of the ions) 0-300 watts
$SiH_4$, $SiCl_4$ or $SiF_4$ rates: 10-200 sccm (cubic centimeters per minute under standard conditions of pressure and temperature)
$N_2$ rates: 10-200 sccm
$O_2$ rate (can be added with the nitrogen or used alone to act on the slope) 1-50 sccm
Ar or He rate: 50-1000 sccm
Biasing power: 50-2000 watts
Pressure: 5-100 millitorrs
Temperature: 10-100° C.
Time: a few seconds to a few hundreds of seconds This temperature range allows promoting the volatility of pulverized species and reduces the re-deposition of the mask on the porous dielectric. The invention therefore limits or eliminates the risk of micro masking and thus improves the precision of etching and the surface of the etched layer of porous dielectric material.

The etching of the dielectric layer is based on the fact that the porous SiOCH is etched by the bombardment of the ions generated by the plasma while a passivation layer 112 made from a form of silicon nitride ($SiN_xF_y$ or $SiN_xCl_y$ or $SiN_xH_y$) or silicon oxide ($SiO_x$) is created spontaneously on the flanks as explained above. The passivation layer is formed with a limited modification of the material constituting the porous dielectric layer.

The thickness of the passivation layer, which increases throughout the etching of the SiOCH, makes it possible to act on the inclination 114 of the flanks of the trench 110. The thickness 116 of the passivation layer, which typically lies in a range of values from 1 to 5 nm, can be adjusted by acting on the parameters of the plasma during etching.

The inclination of the flanks of the trench assist, during back-end of line (BEOL) operations, the obtaining of a satisfactory deposition firstly of the layer forming a barrier to the diffusion of metal, that is to say the layer 195 shown in FIG. 1e, and secondly of the layer of copper intended to fill the trenches in order to form the interconnections.

For example, in order to obtain a passivation layer the thickness 116 of which is 5 nm, the conditions may be, in a CCP reactor: silicon tetrafluoride ($SiF_4$) rate of 90 sccm; nitrogen ($N_2$) rate of 150 sccm; argon (Ar) rate of 600 sccm; pressure of 12 millitorrs; bias power (for controlling the energy of the ions) 50 watts, source power 150 watts, temperature of the slice 65° C.

The important parameters controlling the formation of the passivation layer are the $SiF_4/N_2$ ratio and the source power and the bias power that control the dissociation rate and the energy of the ions, respectively, in a CCP reactor.

Figure 3C:
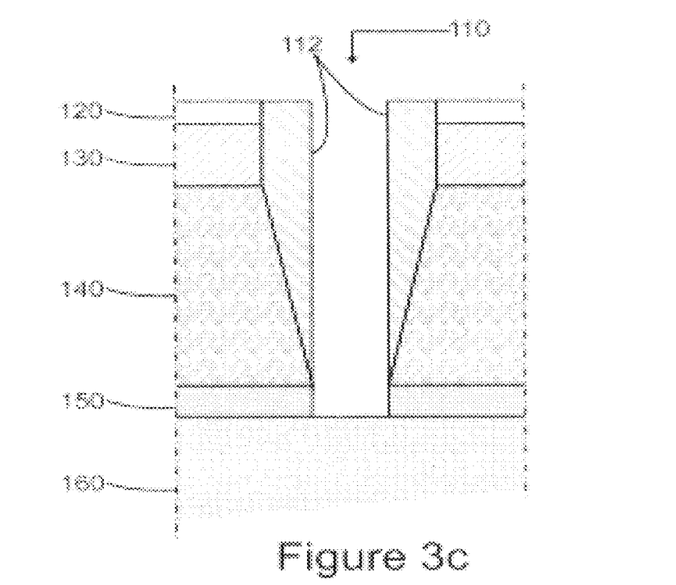

FIG. 3c shows the result of the etching of the stop layer 150 made, as seen, from silicon carbide (SiCH), silicon nitride (SiN) or silicon carbonitride (SiCN). In a preferred embodiment, the etching of this layer 150 is done by means of the same etching chemistry that is used for the porous SiOCH. In this embodiment, the end of the etching would then stop not on the top face of the stop layer 150 as illustrated in FIG. 3b but on the top face of the layer 160 as illustrated in FIG. 3c.

The etching of the layer 150 is performed in the same plasma etcher. The layer of p-SiOCH is in this case always protected from any contamination by the passivation layer 112 that was formed during the previous etching step. It is therefore not altered as in the conventional method.

Figure 3D:
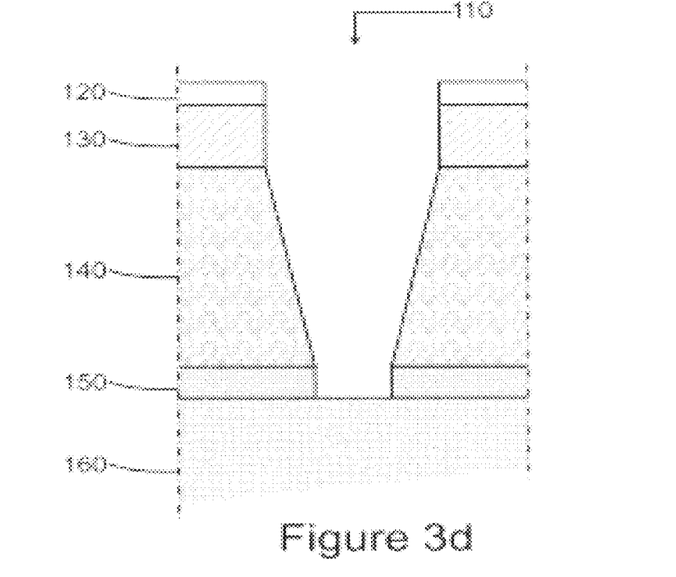

FIG. 3d illustrates the result of the following operation where a new wet cleaning 260 is carried out, which serves in particular to remove the passivation layer, which has become unnecessary. As already mentioned, wet cleanings are done using solutions based on hydrofluoric acid (HF). The passivation layer can be removed for example in a 1% solution of hydrofluoric acid. Depending on the thickness of the layer to be removed the operation may last from a few seconds to a few minutes. In a 1% solution removal of the passivation layer typically takes around 30 seconds.

FIGS. 4a to 4d describe a variant of the method of the invention with which more abrupt flanks 114 of trenches 110 are obtained. To do this, the etching is carried out in as many cycles as necessary to satisfy the specifications of the application in question.

Figure 4A:
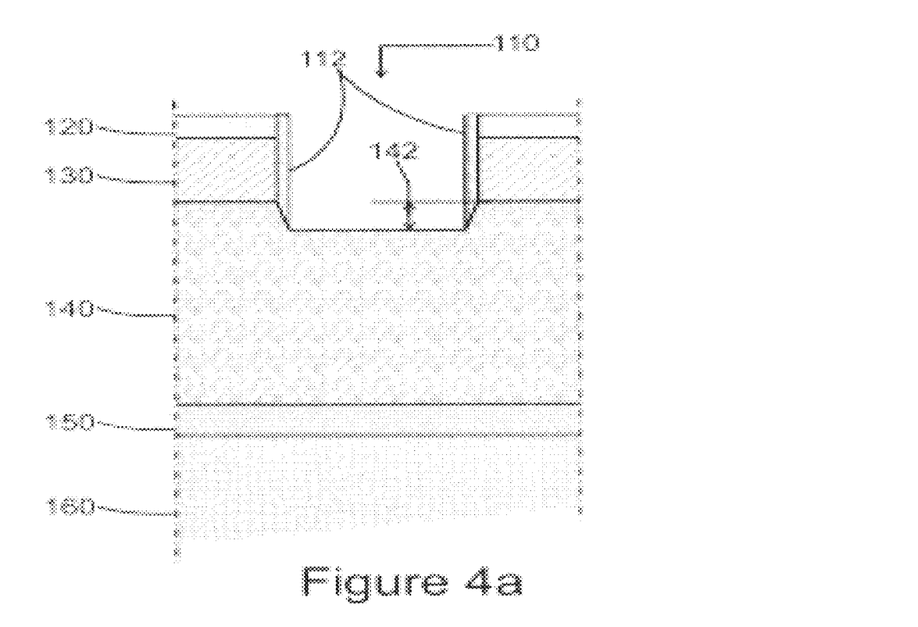
FIGS. 4a to 4d illustrate a variant of the method of the invention that makes it possible to obtain a more abrupt etching of the trenches.

FIG. 4a illustrates the result of a first cycle of partial etching 142 of the layer 140. The partial etching of the dielectric layer is carried out for a short time, particularly for a few seconds, under the same conditions as those described in FIG. 3b. There is a start of formation of a passivation layer 112.

Figure 4B:
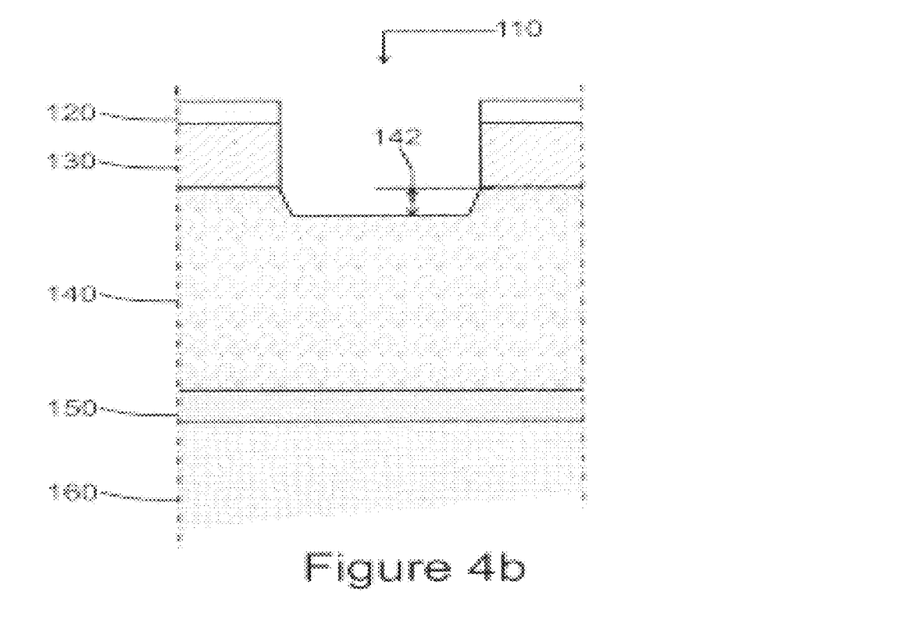

FIG. 4b shows the removal of the passivation layer, which is carried out this time using dry cleaning, which can be performed in the same equipment. The dry removal of the passivation layer made from $SiN_x$ preferably uses a method that is described H Nishini and his co-authors in a publication entitled "Damage-free selective etching of Si native oxides using NH₃/NF₃ and SF₆/H₂O down flow etching" which appeared in the Journal of Applied Physics, volume 74 (2), in July 1993. Although described for silicon dioxide, it has turned out that this method is also suited to silicon nitride. The mechanism is identical and comprises the following steps, which are performed in a reaction chamber where a plasma is formed. A first step consists of generating the etching product in a plasma in accordance with the following chemical reaction:

NF₃+NH₃→NH₄F+NH₄F.HF which makes nitrogen trifluoride (NF₃) react with ammonia (NH₃). The etching takes place during a second step, at a temperature of around 30° C. and more generally 10° C. and 50° C., in the form of a formation of salts in accordance with the following chemical reaction between silicon nitride and the etching product generated by the plasma:

NH₄F or NH₄F.HF+SiNH→(NH₄)₂SiF₆(solid)+H₂ during an operation that lasts for between a few seconds and a few minutes and takes place at a pressure between a few millitorrs and a few torrs. The solid species that are formed during this operation are then sublimated at a temperature above 100° C. for a few tens of seconds in accordance with the following reaction:

(NH₄)2SiF₆(solid)→SiF₄(g)+NH₃(g)+HF(g)

Figure 4C:
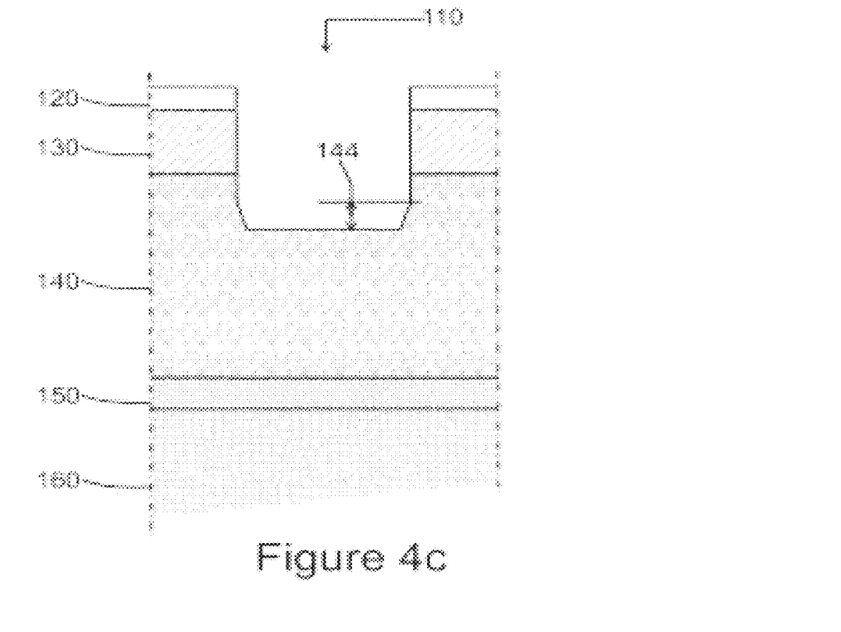

FIG. 4c shows the result of a second etching cycle 144 and removal, by dry cleaning as above, of the passivation layer that re-formed during etching.

Figure 4D:
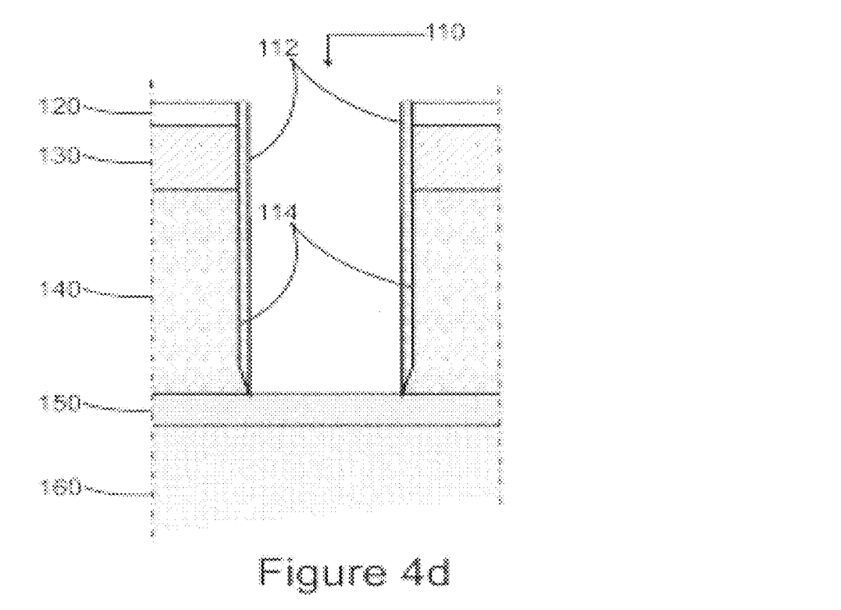

FIG. 4d shows the end result of the etching after sufficient cycles of partial etching and removal of the passivation layer by dry method have been executed. During the first cycle the passivation layer 112, which will serve to protect the flanks 114 of the trench 110 hollowed out in the porous dielectric during the operation of opening the stop layer of the etching 140, is left in place. After which the layer will be removed by wet method as described in FIG. 3d.

Figure 5:
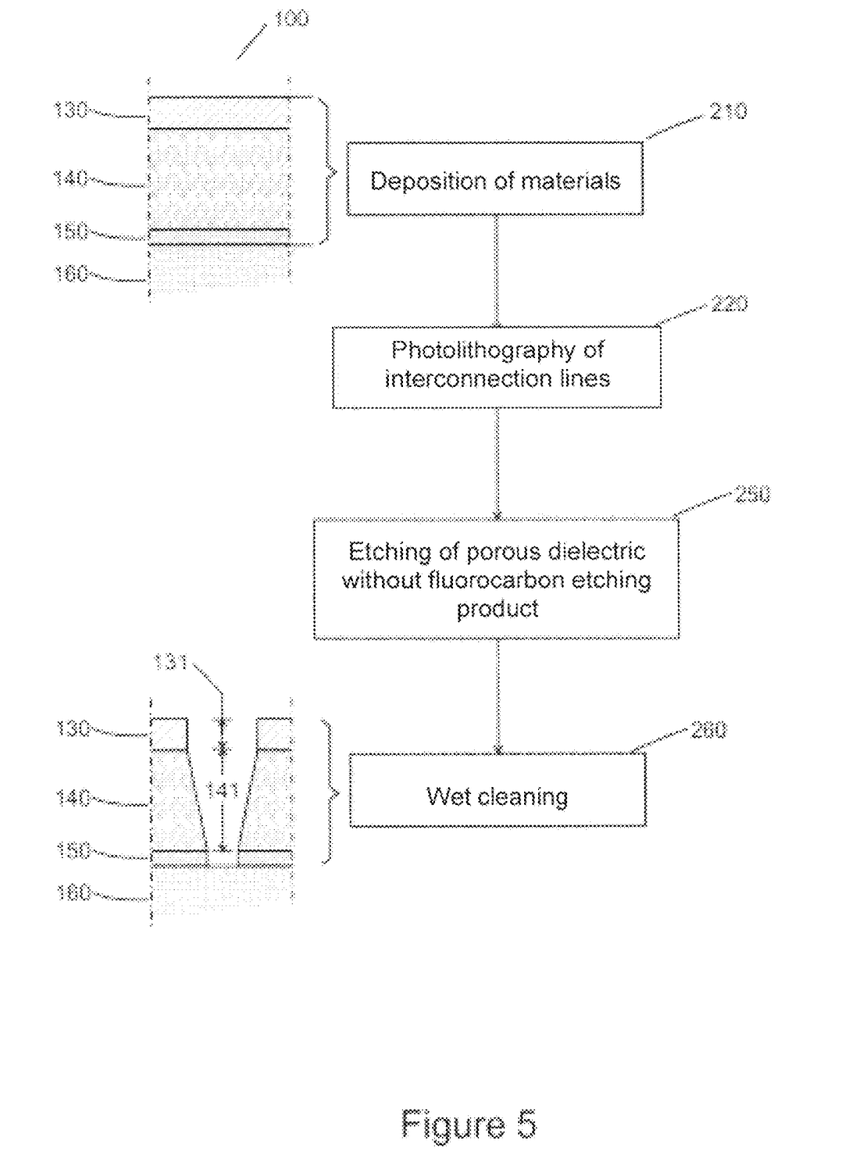
FIG. 5 illustrates another variant of the method of the invention in which a metal hard mask made from titanium nitride (TiN) is not used.

FIG. 5 shows the steps of another variant of the method of the invention in which a metal hard mask is not used and where steps 230 and 240 have been omitted. The layered structure 100 that is deposited at step 210 therefore no longer comprises the layer 120 of titanium nitride (TiN). It is the layer 130 of silicon oxide that will then serve as a hard mask. In this variant of the method the conditions for etching the p-SiOCH are the same as with the metal hard mask as described in FIG. 3b. However, since the etching differential between SiO₂ and p-SiOCH is less great than between TiN and p-SiOCH, it is necessary to provide a greater consumption of SiO₂ during the etching and to respect a minimum ratio between the thickness 141 of the layer to be etched and the thickness 131 of the layer of oxide. Typically, the thickness of the layer of oxide will be ⅕ greater than that of the layer of p-SiOCH. The thickness for each of these layers is measured in a direction perpendicular to the plane in which the layers 134, 140, 160 lie. In this variant of the method, the layer 130, which serves a hard mask, can also be made from silicon nitride (SiN) or dense (non-porous) SiOCH.

In summary, on one hand, the replacement of the traditional etching of pSiOCH by non-fluorocarbon etching means that there is no modification of the material of the flanks of the trenches during the etching and no fluorinated residues that prevent the wet cleaning operation being able to be carried out effectively as seen in FIG. 1e. These two problems contribute to a reduction in reliability of the devices produced with the standard method. On the other hand, in the case of the invention, the passivation layer made from SiO$_x$ or SiN$_x$ protects the porous dielectric throughout the etching and is completely removed afterwards by means of wet cleaning.

Moreover, the variant of the method described in FIG. 5 makes it possible to dispense with the use of a metal hard mask made from TiN and therefore numerous associated problems that were described in FIGS. 1b, 1c and 1d. The method thus simplified results in better productivity and less cost.

The invention claimed is:

1. A method of etching a layer of porous dielectric material formed on an underlying layer, comprising:
    etching the layer of porous dielectric material to expose the underlying layer by uninterrupted etching in a plasma formed from at least one silicon-based gas mixed with oxygen (O₂) and/or nitrogen (N₂); and
    growing, during said etching, a passivation layer at least on flanks of etched portions of the layer of porous dielectric material,
    wherein the at least one silicon-based gas is taken from a compound of a type consisting of Si$_x$F$_y$, or a compound of a type consisting of Si$_x$Cl$_y$,
        where x is the proportion of silicon (Si) in the gas and y is the proportion of fluorine (F) or chlorine (Cl) in the gas, and
    wherein during said etching, the layer of porous dielectric material is maintained at a temperature between 40° C. and 100° C.

2. The method according to claim 1, wherein the plasma also comprises argon (Ar) or helium (He).

3. The method according to claim 1, further comprising modifying at least one parameter of the following parameters to adjust an inclination of the flanks:
    concentration of nitrogen and/or oxygen in said plasma formed from the at least one silicon-based gas mixed with oxygen (O₂) and/or nitrogen (N₂), and
    temperature of the layer of porous dielectric material.

4. The method according to claim 1, further comprising modifying at least one parameter of the following parameters to adjust a thickness of the passivation layer:
    concentration of nitrogen and/or oxygen in said plasma formed from the at least one silicon-based gas mixed with oxygen (O₂) and/or nitrogen (N₂), and
    temperature of the layer of porous dielectric material.

5. The method according to claim 1, further comprising removing the passivation layer after the etching and the growing, the removing comprising wet etching to fully dissolve the passivation layer.

6. The method according to claim 5, wherein the wet etching comprises applying a solution based on hydrofluoric acid (HF).

7. The method according to claim 1, wherein the layer of porous dielectric material is silsesquioxane from a formula (R—SiO$_{3/2}$)n, where R is a methyl group (—CH3) or a hydrogen atom (—H) and n is an even integer.

8. The method according to claim 1, wherein the layer of porous dielectric material is a porous silicon oxide doped with carbon and hydrogen (SiOCH).

9. The method according to claim 1, further comprising, before the etching, providing a mask surmounting the layer of the porous dielectric material, the mask having at least one pattern, and then performing the etching through the mask to transfer the pattern into the etched layer of the porous dielectric material.

10. The method according to claim 9, wherein the mask is made from silicon oxide ($SiO_2$), silicon nitride (SiN), or dense SiOCH.

11. The method according to claim 9,
wherein the porous dielectric material is porous SiOCH, and
wherein the mask is made from silicon oxide ($SiO_2$), silicon nitride (SiN), or dense SiOCH, and has a thickness greater than one fifth of a thickness of the layer of the porous dielectric material.

12. The method according to claim 9,
wherein the mask has a bottom face in contact with the layer of the porous dielectric material and a top face opposite to the bottom face, and
wherein said top face is in contact with an etching solution during the etching through the mask.

13. The method according to claim 9, wherein the mask has a thickness such that the mask is not entirely consumed during the etching.

14. The method according to claim 9, wherein the mask is made of a metal.

15. The method according to claim 9, further comprising:
before the providing of the mask, providing a stop layer under the layer of the porous dielectric material, the stop layer being configured to stop the etching;
after the etching and the growing, etching the stop layer; and
after the etching of the stop layer, removing the passivation layer.

16. The method according to claim 9, further comprising:
before the providing of the mask, providing a stop layer under the layer of the porous dielectric material that, when the stop layer is subjected to the plasma during the etching, has an etching rate that is less than an etching rate of the layer of the porous dielectric material, and wherein the stop layer is etched following the etching of the layer of the porous dielectric material using said plasma.

17. The method according to claim 9, wherein the etching through the at least one pattern of the mask forms at least one trench in the layer of the porous dielectric material, the method further comprising, after the etching of the layer of the porous dielectric material, filling the at least one trench with an electrically conductive material.

18. The method according to claim 17, wherein the growing includes growing the passivation layer along a length of sidewalls of the at least one trench.

19. The method according to claim 17, wherein the at least one trench forms an electrical interconnection.

20. The method according to claim 1,
wherein, before the etching, the layer of the porous dielectric material covers a gate of a transistor, and
wherein the etching is effected anisotropically in a principal direction parallel to flanks of the gate, so as to remove the layer of the porous dielectric material only outside the flanks of the gate of the transistor in order to form spacers for the gate.

21. The method according to claim 1, wherein the at least one silicon-based gas is silicon tetrachloride ($SiCl_4$) or silicon tetrafluoride ($SiF_4$).

22. The method according to claim 21,
wherein the at least one silicon-based gas includes silicon tetrafluoride ($SiF_4$) in the presence of oxygen ($O_2$), combined with argon (Ar), and
wherein the passivation layer is a silicon oxide ($SiO_x$).

23. The method according to claim 21,
wherein the least one silicon-based gas includes silicon tetrachloride ($SiCl_4$) in the presence of oxygen ($O_2$), combined with argon (Ar), and
wherein the passivation layer is a silicon oxide ($SiO_x$).

24. The method according to claim 21,
wherein the at least one silicon-based gas includes silicon tetrafluoride ($SiF_4$) in the presence of nitrogen ($N_2$), combined with argon (Ar), and
wherein the passivation layer is a silicon nitride ($SiN_xF_y$).

25. The method according to claim 21,
wherein the at least one silicon-based gas includes silicon tetrachloride ($SiCl_4$) in the presence of nitrogen ($N_2$), combined with argon (Ar), and
wherein the passivation layer is a silicon nitride ($SiN_xCl_y$).

26. The method according to claim 21,
wherein the at least one silicon-based gas includes silicon tetrafluoride ($SiF_4$) in the presence of nitrogen ($N_2$) and oxygen ($O_2$), combined with argon (Ar), and
wherein the passivation layer is a silicon oxynitride ($SiON_xF_y$).

27. The method according to claim 21,
wherein the at least one silicon-based gas includes silicon tetrachloride ($SiCl_4$) in the presence of nitrogen ($N_2$) and oxygen ($O_2$), combined with argon (Ar), and
wherein the passivation layer is a silicon oxynitride ($SiON_xCl_y$).

28. A method of etching a layer of porous dielectric material, comprising:
etching the layer of porous dielectric material in a plasma formed from at least one silicon-based gas mixed with oxygen ($O_2$) and/or nitrogen ($N_2$); and
growing, during said etching, a passivation layer at least on flanks of etched portions of the layer of porous dielectric material,
wherein the at least one silicon-based gas is a compound of a type consisting of $Si_xH_y$, for which a ratio x/y is equal to or greater than 0.3,
where x is the proportion of silicon (Si) in the gas and y is the proportion of hydrogen (H) in the gas, and
wherein during said etching, the layer of porous dielectric material is maintained at a temperature between 40° C. and 100° C.

* * * * *